United States Patent [19]
Goncharoff

[11] 3,849,601
[45] Nov. 19, 1974

[54] VOLUME AND TONE CONTROLS FOR MULTICHANNEL AUDIO SYSTEMS

[75] Inventor: Nikolai Goncharoff, Roselle, Ill.

[73] Assignee: Motorola, Inc., Chicago, Ill.

[22] Filed: Oct. 9, 1973

[21] Appl. No.: 404,554

[52] U.S. Cl. .............. 179/1 D, 179/1 VL, 325/424, 333/28 T, 330/30 D
[51] Int. Cl. .............................................. H03g 5/16
[58] Field of Search ............ 179/1 VL, 1 D; 330/29, 330/30, 31; 333/28 T; 325/424

[56] References Cited

UNITED STATES PATENTS

| | | | |
|---|---|---|---|
| 2,073,504 | 3/1937 | Travis | 333/28 T |
| 3,472,957 | 10/1969 | Kaye et al. | 178/7.1 |
| 3,725,583 | 4/1973 | Gunderson et al. | 179/1 VL |
| 3,769,459 | 10/1973 | Niffennegger et al. | 179/1 VL |

*Primary Examiner*—Kathleen H. Claffy
*Assistant Examiner*—E. S. Matt Kemeny
*Attorney, Agent, or Firm*—Donald J. Lisa; Vincent J. Rauner

[57] ABSTRACT

A single volume control and a single independent tone control set a plurality of audio channels. Each channel contains a gain-controllable differential amplifier operated as small-signal amplifier, driven by a constant-current source transistor which also accepts the input audio signal.

Gain is varied by altering the DC bias on one of the differential amplifier elements. However, such variation causes noise which is cancelled by a second differential amplifier connected in parallel with the first, but oppositely Phase *d*.

Tone is varied by shunting the input with capacitors in series with a pair of oppositely conducting transistors which function as level-controlled resistors.

4 Claims, 1 Drawing Figure

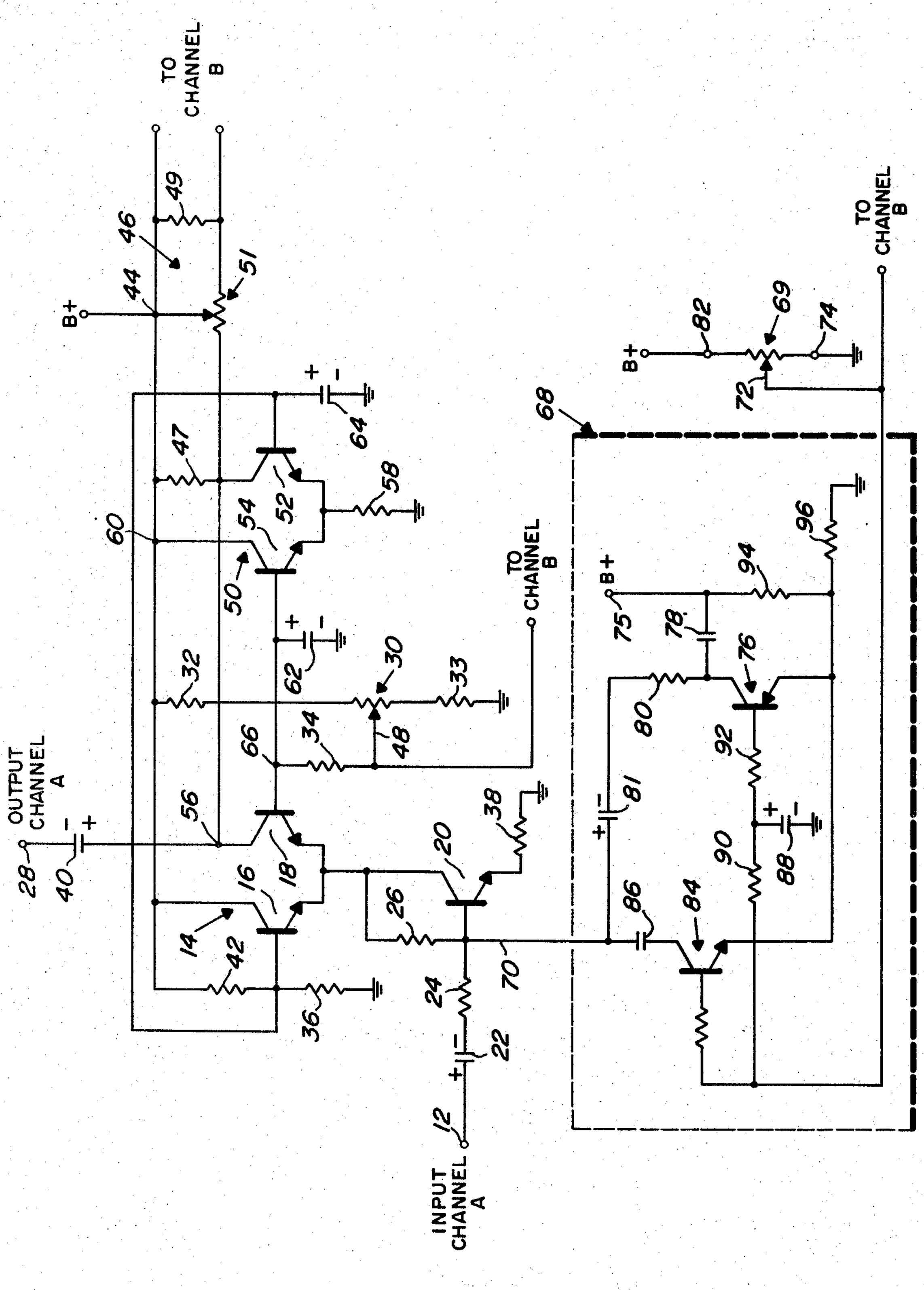
TO CHANNEL B
TO CHANNEL B
TO CHANNEL B
B+
B+
B+
OUTPUT CHANNEL A
INPUT CHANNEL A

VOLUME AND TONE CONTROLS FOR MULTICHANNEL AUDIO SYSTEMS

BACKGROUND

This invention relates generally to audio systems and more particularly to volume and tone control circuits therefor.

In co-pending U.S. Pat. application Ser. No. 56,313, filed July 20, 1970 in the name of Paul J. Niffenegger and Ronald J. Freimark and assigned to the same assignee as the instant invention, there is described volume and tone control circuits for a dual channel audio system. The tone control circuit includes a pair of transistors, one for each channel of the dual channel system, the biases of which are adjusted by a single potentiometer to in turn adjust the bias on a pair of transistors receiving right and left channel input signals. Changing the biases on the tone control circuit transistors with the potentiometer effectively adjusts bass boost and treble cut in the audio output.

The outputs from the signal receiving transistors are passed to a pair of differential amplifiers, respectively. A single volume control potentiometer is coupled to both the differential amplifiers. Audio output signals are taken from the collectors of predetermined ones of the transistors of the differential amplifiers and fed to loudspeakers.

While the tone and volume control circuits operate efficiently to adjust the tonal quality and volume, respectively, of the audio produced at the loudspeakers, it is necessary to connect the tone control circuit back to the volume control circuit for adjustment of the volume along with tone since in fact all that the tone control circuit accomplishes is to cut the treble or highs. Adjustment of the volume when the highs are cut predeterminedly, provides the bass boost effect. The latter restricts somewhat, the control over the tonal quality of the audio produced by the system.

In addition to the above, in the circuit of the co-pending application, movement of the volume control to provide a current change in the differential amplifiers from which the audio output signals are derived, can cause noticeable noise in the audio emanating from the loudspeakers.

SUMMARY

Accordingly, it is a primary object of the present invention to provide in an audio system, a new and improved tone control circuit which overcomes the drawbacks of the prior art circuit employed in the audio system described heretofore.

It is another object of the present invention to provide in an audio system a tone control circuit which is independent of the volume control circuit and which provides both bass boost and treble cut to the audio.

It is still another object of the present invention to provide in an audio system as described heretofore, a volume control circuit which eliminates any noise attributable to the mechanical operation of the volume control potentiometer.

It is yet another object of the present invention to provide in an audio system of the above described type, tone and volume control circuits which are efficient in operation and relatively inexpensive to produce.

Briefly, a preferred embodiment of the invention includes, in an audio system which may be of the dual channel type, an audio output circuit including for each channel, a differential amplifier from which the audio output signals are derived in accordance with the setting of a volume control circuit included in this system. Output signals are also taken from a second differential amplifier connected in parallel relation with the first-mentioned differential amplifier, but the signals are out of phase with the signals therefrom to maintain substantially constant the voltage level of the output signals at a common point, despite noise due to mechanical movement of the volume control knob.

A tone control circuit is also provided in the system which is independent of the volume control circuit. The tone control circuit includes a potentiometer which can be moved to three setting ranges. A first minimum setting range provides from 0 to 3 volts, rendering the first of a pair of oppositely conductive transistors connected in circuit, conductive, to provide a flat response. A second setting range provides 3 to 5 volts to cut off the last-mentioned transistor thereby permitting a capacitor-resistor combination to function to provide a bass boost. In the maximum setting, 5 to 8 volts are provided to bias the second transistor of the pair to an on condition while maintaining the first transistor in the off condition. The latter cuts treble or highs through the combination of the second transistor and a capacitor coupled to the output electrode thereof, as well as continues to provide a bass boost through the previously described capacitor-resistor combination.

A capacitor and resistors coupled to the base electrode of the first-mentioned transistor delays the signal thereto to eliminate substantially noise from the mechanical movement of the tone control knob.

DESCRIPTION OF THE DRAWING

In the drawing:

The single FIGURE is a schematic diagram of one channel of a dual channel audio system including the volume and tone control circuits according to the invention.

DETAILED DESCRIPTION

The single FIGURE of the drawing illustrates one channel, shown as channel "A" of a dual channel audio system including volume and tone control circuits according to the invention. The second channel is the same as that shown and operates similarly thereto. As such, the second channel has not been shown or described herein. Only the connections to the channel, indicated "to channel B" have been indicated.

In the circuit portion illustrated, an input signal at terminal 12 is applied to a differential amplifier stage 14 including a pair of transistors 16, 18 which have the emitter electrodes interconnected and coupled to a transistor 20 which serves as a current source for the differential amplifier, simultaneously providing a signal path from the input terminal 12 to the emitters of the transistors 16, 18. The signal applied at input 12 is coupled through a capacitor 22 and a resistor 24 to the base electrode of transistor 20 which in turn is forward biased by a resistor 26 connected across the base and collector electrodes of the transistor.

Transistor 20 is biased to a state of conduction for translating a substantially constant signal to the differential amplifier 14 when the input signal is constant at 12. The amount of the signal coupled to output 28 of the differential amplifier 14 depends on the volume control setting of potentiometer 30. As shown, the potentiometer is connected via resistor 32 to a source of B+ to provide bias potential to the base of transistor 18 of the differential amplifier 14, through resistor 34. The potentiometer is also connected to ground potential through another resistor 33. Transistor 16 of the differential amplifier is forward biased by the voltage divider network including resistors 36 and 42 which are connected between ground and B+, respectively.

With transistor 20 properly biased, the signal from the input terminal 12 is translated through transistor 20 and into the differential amplifier 14 such that only a portion of the signal may be applied to output terminal 28 through a coupling and DC blocking capacitor 40. Control 46 is connected to the collector of transistor 18 and to a similar transistor in the second channel of the system (not shown) for differentially varying the collector impedance of the transistors to provide balance control. The balance control includes fixed load resistors 47, 49 and variable resistor 51.

It has been found that mechanical motion of the volume control wiper 48 produces noise through a speaker coupled to the output terminal 28 of the amplifier circuit. The noise, it has been discovered, is caused by the change in bias on the base of transistor 18 of the differential amplifier 14. Such a change in bias due to motion of the wiper 48 of the potentiometer 30 causes the voltage at point 56 to vary and thus produce the resultant noise. To compensate for this and to prevent such noise, a second differential amplifier 50 is connected in parallel relation with the differential amplifier 14 with the output therefrom being taken from the collector of transistor 52 which is out of phase with the output of transistor 18 of differential amplifier 14. Taking the output at this point maintains the voltage at terminal 56 substantially constant and thereby eliminates noise due to the mechanical movement of the volume control wiper 48.

As can be seen in the drawing, the differential amplifier 50 includes transistors 52, 54. The emitter of the transistors are connected together through a resistor 58 to ground and the collector electrode of transistor 54 is connected to B+ at terminal 60. DC blocking capacitors 62, 64 are connected to respective base electrodes of transistors 54, 52 to ground potential and the base of transistor 54 is coupled at terminal 66 to the base of transistor 18 and to the resistor 34.

A tone control circuit 68 outlined in the dashed box is provided for varying the bass and treble of the output of channel A of the audio system. A tone control potentiometer 69 is connected to the last-mentioned circuitry for controlling the operation thereof. The tone control potentiometer is likewise converted to similar tone control circuitry (not shown) for channel "B" of the audio system. Effectively, the tone control potentiometer is incorporated as part of the tone control circuitry for both channels "A" and "B" of the system. The tone control circuit is coupled via lead 70 to the input or base of signal translating transistor 20.

In the tone control circuit, when wiper 72 of potentiometer 69 is placed toward the minimum setting, 74, approximately 0–3 volts are provided from the B+ source 75 to the transistor circuits. In the latter setting, transistor 76 is rendered conductive to divert both high and low frequency components of the input signal provided at input 12 to ground. In this setting, a flat response is provided.

Movement of wiper 72 to a central position provides 3–5 volts bias to the circuits to render transistor 76 cut off. In this state, capacitor 78 and resistor 80 are utilized to channel some of the high frequency components of the input signal to ground, thus providing a bass boost effect to the output of a speaker coupled at terminal 28. A DC blocking capacitor 81 is provided between lead 70 and the resistor-capacitor combination.

Movement of the wiper to a maximum setting, 82, provides 5–8 volts of bias to the circuit for rendering transistor 84, which is of an opposite conductivity type from transistor 76, to a conductive state. Transistor 76 is held in a cut off state during this time. In this case, more of the high frequency component of the input signal is diverted away from the signal translating transistor 20 through capacitor 86 and transistor 84 to ground. Likewise, the bass boost effect is maintained through the diversion of a portion of the high frequency component of the signal through the resistor-capacitor combination, 80, 78. In this setting a treble cut effect is provided.

In the circuit, capacitor 88 and the associated resistors 90, 92 are provided to suppress any noise signal directed to transistor 76 due to the mechanical movement of the wiper 72. A voltage divider network comprising resistors 94, 96 provides the proper reference voltage at the emitters of transistors 76 and 84.

With the tone control circuit according to the invention, changes in the tonal quality of the output at terminal 28 can be made without changing the volume setting. Since both bass boost and treble cut are provided with the circuit, volume compensation need not be provided.

While a particular embodiment of the invention has been shown and described, it should be understood that the invention is not limited thereto since many modifications may be made. It is therefore contemplated to cover by the present application any and all such modifications as fall within the true spirit and scope of the appended claims.

I claim:

1. In an audio signal translating system including a differential amplifier having first and second transistors, one of the transistors being connected to an output terminal, a signal translating transistor component including an input and output, the output thereof being connected to the first and second transistors of said differential amplifier for applying operating current and simultaneously an audio signal path thereto, an audio signal input means coupled to the input of said signal translating transistor to provide an input signal thereto, settable volume control means coupled to said differential amplifier a predetermined portion of said audio signal being passed by said differential amplifier to said output terminal in accordance with the setting of said volume control means, a tone control circuit connected to said input of said signal translating transistor for diverting predetermined frequency components of said audio signal therefrom to adjust the tonal quality of the audio signal passed to said output terminal, said tone control circuit including in combination; tone control selector means coupled to a source of power, first and second transistor means coupled electrically to said tone control selector means and capacitor means, said tone control selector means being movable to a first setting for providing a first predetermined voltage for rendering a first one of said first and second transistor means conductive, whereby high and low frequency components of said audio signal are diverted from said signal translating transistor through said first-mentioned transistor means, to provide a relatively flat frequency response to said audio output, to a second setting for providing a second predetermined voltage to render said first transistor means cut off, whereby high frequency components of said audio signal are diverted from said signal translating transistor through said capacitor means to provide a bass boost to said audio output and to a third setting for providing a third predetermined voltage for rendering said second transistor means conductive while maintaining said first transistor means cut off, whereby additional high frequency components of said audio signal are diverted from said signal translating transistor through said second transistor means while also diverting other high frequency components of said audio signal through said capacitor means, to provide a treble cut effect to said audio output.

2. An audio signal translating system as claimed in claim 1 wherein said first and second transistor means are of opposite conductivity, wherein each said first and second transistor means includes first and second electrodes and wherein said tone control selector means includes variable resistance means coupled between a source of power and the first electrodes of said first and second transistor means, the second electrodes of said first and second transistor means being coupled to said signal translating transistor.

3. An audio signal translating system as claimed in claim 2 wherein said tone control circuit further includes noise suppression means interposed electrically between the first electrode of the first one of said transistor means and said tone control selector means for suppressing noise due to the mechanical movement of said variable resistance means, said noise suppression means including a combination resistance means and capacitor means coupled in parallel electrical relation with respect to each other, the combination being connected in series with said first electrode of said one transistor and said variable resistance means.

4. An audio signal translating system as claimed in claim 1 wherein the output from said differential amplifier is taken at the collector electrode of a first one of said first and second transistors thereof, wherein said system further includes a second differential amplifier connected in parallel relation with said first-mentioned differential amplifier, said second differential amplifier also being connected to said settable volume control means and wherein the collector of the second transistor of said second differential amplifier is connected to said output terminal so that an output signal is taken therefrom which is out of phase with the signal taken from said first differential amplifier, whereby the level of the output signal at said output terminal is maintained substantially constant to eliminate mechanical noise due to the movement of said settable volume control means.

* * * * *